United States Patent
Lee

(10) Patent No.: US 7,719,013 B2
(45) Date of Patent: May 18, 2010

(54) SEMICONDUCTOR LIGHT EMITTING DEVICE AND METHOD OF MANUFACTURING THE SAME

(75) Inventor: Jeong-wook Lee, Yongin-si (KR)

(73) Assignee: Samsung Electro-Mechanics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 11/289,292

(22) Filed: Nov. 30, 2005

(65) Prior Publication Data

US 2006/0118798 A1 Jun. 8, 2006

(30) Foreign Application Priority Data

Dec. 2, 2004 (KR) .................. 10-2004-0100354

(51) Int. Cl.
H01L 29/18 (2006.01)
H01L 29/22 (2006.01)

(52) U.S. Cl. .................. 257/88; 257/99; 257/98; 257/100; 257/103; 257/90; 257/94; 257/85

(58) Field of Classification Search ............. 257/79, 257/88, 90, 94, 96, 97, 98–100, 85, 103
See application file for complete search history.

(56) References Cited

U.S. PATENT DOCUMENTS

| | | | |
|---|---|---|---|
| 6,125,226 A * | 9/2000 | Forrest et al. | 385/131 |
| 6,423,984 B1 | 7/2002 | Kato et al. | |
| 6,686,610 B2 | 2/2004 | Sheu | |
| 6,765,234 B2 | 7/2004 | Koide | |
| 7,061,065 B2 | 6/2006 | Horng et al. | |
| 7,135,711 B2 | 11/2006 | Linder et al. | |
| 2003/0102473 A1* | 6/2003 | Chason et al. | 257/43 |
| 2003/0122147 A1* | 7/2003 | Sheu | 257/103 |
| 2003/0231683 A1* | 12/2003 | Chua et al. | 372/46 |
| 2004/0079951 A1 | 4/2004 | Horng et al. | |
| 2004/0213017 A1* | 10/2004 | Chou et al. | 362/558 |
| 2005/0098789 A1* | 5/2005 | Kozaki | 257/97 |
| 2005/0164586 A1* | 7/2005 | Autran et al. | 442/361 |
| 2007/0018186 A1* | 1/2007 | Shin et al. | 257/98 |
| 2007/0120136 A1* | 5/2007 | Noda et al. | 257/98 |

FOREIGN PATENT DOCUMENTS

| | | |
|---|---|---|
| KR | 2003-0017686 | 3/2003 |
| KR | 20040008962 A | 1/2004 |
| WO | WO 03/017320 | 2/2003 |
| WO | WO 03/026355 A2 | 3/2003 |

OTHER PUBLICATIONS

Korean Office Action dated Apr. 3, 2006.
Office Action issued on Sep. 19, 2008 in corresponding Chinese Patent Application No. 200510131007.8, (7 pages) and English-language translation of the text of the Office Action (5 pages).
European Search Report dated Dec. 22, 2009.

* cited by examiner

*Primary Examiner*—Kenneth A Parker
*Assistant Examiner*—Joseph Nguyen
(74) *Attorney, Agent, or Firm*—Buchanan Ingersoll & Rooney PC

(57) ABSTRACT

A semiconductor light emitting device and a method of manufacturing the semiconductor light emitting device are provided. The semiconductor light emitting device includes a substrate, at least two light emitting cells located on the substrate and formed by stacking semiconductor material layers, a reflection layer and a transparent insulating layer sequentially stacked between the light emitting cells, and a transparent electrode covering the upper surface of the light emitting cells.

18 Claims, 8 Drawing Sheets

SEMICONDUCTOR LIGHT EMITTING DEVICE AND METHOD OF MANUFACTURING THE SAME

CROSS-REFERENCE TO RELATED PATENT APPLICATION

This application claims the benefit of Korean Patent Application No. 10-2004-0100354, filed on Dec. 2, 2004, in the Korean Intellectual Property Office, the disclosure of which is incorporated herein in its entirety by reference.

BACKGROUND OF THE DISCLOSURE

1. Field of the Disclosure

The present disclosure relates to a semiconductor light emitting device and a method of manufacturing the same, and more particularly, to a semiconductor light emitting device composed of a plurality of light emitting cells and a reflection film, and a method of manufacturing the same.

2. Description of the Related Art

Light emitting diodes (LEDs) are widely used as a means for transmitting, recording, or reading data in communication devices, such as optical communication devices, or in electronic devices, such as compact disc players (CDPs) and digital versatile disc players (DVDPs). The LEDs are expanding in applications to large outdoor sign boards, LCD backlights, and illumination devices.

Conventional semiconductor light emitting devices have used a sapphire substrate. The sapphire substrate can readily grow GaN light emitting cells with a thickness of 5 μm or more. However, the sapphire substrate is expensive and the manufacturing size is limited. Therefore, attempts to form large, inexpensive GaN light emitting cells on a silicon substrate have been made.

The light emitting diode having the GaN light emitting cells grown on a silicon substrate has a drawback in that there is a high possibility of cracks forming in the GaN light emitting cells due to the differences in the lattice constant and thermal expansion coefficient between the GaN light emitting cells and the silicon. The thickness of the GaN light emitting cells grown on the silicon substrate is generally limited to less than 1.0 μm to avoid cracking. However, when the GaN light emitting cells are too thin, their driving voltage becomes too high.

FIG. 1 illustrates an example of a matrix type display having a plurality of light emitting cells arranged in an array on a silicon substrate.

Referring to FIG. 1, a plurality of GaN semiconductor light emitting cells 120 are disposed on one silicon substrate 110, and each of the GaN semiconductor light emitting cells 120 forms a light emitting source. A desired image can be displayed on one substrate 110 by driving all the GaN semiconductor light emitting cells 120. Each of the GaN semiconductor light emitting cells 120 has a rectangular shape and the longer side of the rectangle is approximately 100 μm. The distance between the adjacent GaN semiconductor light emitting cells 120 is approximately 10 μm.

A conventional display having an array of the above GaN semiconductor light emitting cells 120 has a structure in which a low temperature nitride aluminum (LT-AlN) buffer layer is formed on the silicon substrate and a GaN semiconductor material layer is formed on the LT-AlN buffer layer. The structure can reduce defects and cracks of a GaN semiconductor material layer since the structure reduces residual stresses in the GaN semiconductor material layer. However, the structure requires a complex manufacturing process and, particularly, has a low optical output.

SUMMARY OF THE DISCLOSURE

The present invention may provide a semiconductor light emitting device that can minimize cracking in light emitting cells grown on a silicon substrate and effectively increase an optical output of the light emitting device.

The present invention also may provide a method of manufacturing the semiconductor light emitting device.

According to an aspect of the present invention, there may be provided a light emitting device comprising: a substrate; at least two light emitting cells disposed on the substrate and formed by stacking semiconductor material layers; a reflection layer and a transparent insulating layer sequentially stacked between the light emitting cells; and a transparent electrode covering the upper surface of the light emitting cells. The substrate may be formed of silicon Si.

The light emitting device may further comprise a buffer layer between the substrate and the light emitting cells. For example, the buffer layer may be an III-V nitride group semiconductor layer of a GaN group.

The sum of thicknesses of the transparent insulating layer and the reflection layer may be greater than the thickness of the light emitting cell. The transparent insulating layer may be thicker than the reflection layer. The ratio of the width to the thickness of the light emitting cell may be at least greater than the tangent value of the total reflection angle of the transparent insulating layer with respect to the light emitting cell.

The transparent insulating layer may have a lower refraction index than a semiconductor material layer that constitutes the light emitting cell. The transparent insulating layer may be formed at least one of $SiO_2$, $SiN_x$, $Al_2O_3$, HfO, ZrO, $TiO_2$, and ZnO.

The transparent electrode may be formed of one of a metal and a transparent conductive material (TCO). The metal may be one of Au, Pd, Pt, Ru, and Ni. The TCO may be one of ZnO and indium oxide. The indium oxide may further comprise at least one element selected from the group consisting of Mg, Ag, Zn, Sc, Hf, Zr, Te, Se, Ta, W, Nb, Cu, Si, Ni, Co, Mo, Cr, Mn, Hg, Pr, and one component of the La group.

The reflection layer may be formed of one of a metal layer or a plurality of dielectric layers. Also, the reflection layer may be formed of a plurality of stacked layers in which one or more pairs of a metal layer and a dielectric layer are repeatedly stacked.

The light emitting device may further comprise a GaN layer between the substrate and the light emitting cell, and a buffer layer between the substrate and the GaN layer. The buffer layer may be a III-V group nitride semiconductor layer of the GaN group.

According to another aspect of the present invention, there is provided a method of manufacturing a light emitting device comprising: forming a transparent insulating layer on a substrate (operation 1); forming at least one hole in the transparent insulating layer (operation 2); forming a light emitting cell in the hole by stacking semiconductor material layers (operation 3); and forming a transparent electrode covering the light emitting cells (operation 4).

The transparent insulating layer may be thicker than the light emitting cell. The transparent insulating layer may be formed of a material having a lower refractive index than the semiconductor material layer that constitutes the light emitting cell. The transparent insulating layer may be formed of at least one of $SiO_2$, $SiN_x$, $Al_2O_3$, HfO, ZrO, $TiO_2$, and ZnO.

The transparent electrode may be formed of one of a metal and a transparent conductive material (TCO). The metal may be one of Au, Pd, Pt, Ru, and Ni. The TCO may be one of ZnO and indium oxide. The indium oxide may further comprise at least one element selected from the group consisting of Mg, Ag, Zn, Sc, Hf, Zr, Te, Se, Ta, W, Nb, Cu, Si, Ni, Co, Mo, Cr, Mn, Hg, Pr, and one component of the La group.

The forming of the transparent electrode covering the light emitting cells (operation 4) may comprise forming a reflection layer covering the transparent insulating layer and the light emitting cells, and may further comprise forming a heat transfer layer on the reflection layer. The forming of the transparent electrode covering the light emitting cells (operation 4) may further comprise removing the substrate, and may further comprise forming a transparent electrode covering the lower surfaces of the light emitting cells. The heat transfer layer may be formed of one of Cu, Si, and a Cu alloy.

The forming of the transparent insulating layer on the substrate (operation 1) may further comprise forming a reflection layer between the substrate and the transparent insulating layer, and the forming of at least one hole in the transparent insulating layer (operation 2) may comprise forming holes in the transparent insulating layer and the reflection layer until the substrate is exposed. The forming of the transparent insulating layer on the substrate (operation 1) may further comprise forming a buffer layer between the substrate and the GaN layer. The buffer my be formed of a III-V group nitride semiconductor layer of the GaN group.

The sum of the thicknesses of the transparent insulating layer and the reflection layer may be greater than the thickness of the light emitting cells. The transparent insulating layer may be thicker than the reflection layer. The ratio of the width to the thickness of the light emitting cell may be greater than the tangent of the total internal reflection angle of the transparent insulating layer with respect to the light emitting cell.

The reflection layer may be formed of a metal layer or a plurality of dielectric layers. The reflection layer may be formed of a plurality of stacked layers in which one or more pairs of a metal layer and a dielectric layer are repeatedly stacked.

The reflection layer formed on the substrate may reduce the light absorption by the substrate. The height of the light emitting cell may be limited so that light emitted from the light emitting cell can pass through the transparent insulating layer. The transparent insulating layer filling the spaces between the light emitting cells may contribute to the emission of the light to the outside. Accordingly, these methods may reduce cracking in the stacked light emitting cells on the Si substrate, and thus may increase the optical output of the light emitting device.

BRIEF DESCRIPTION OF THE DRAWINGS

The above and other features and advantages of the present invention next will be described in detail in exemplary embodiments thereof with reference to the attached drawings in which.

DETAILED DESCRIPTION OF EXEMPLARY EMBODIMENTS

Figure 1:
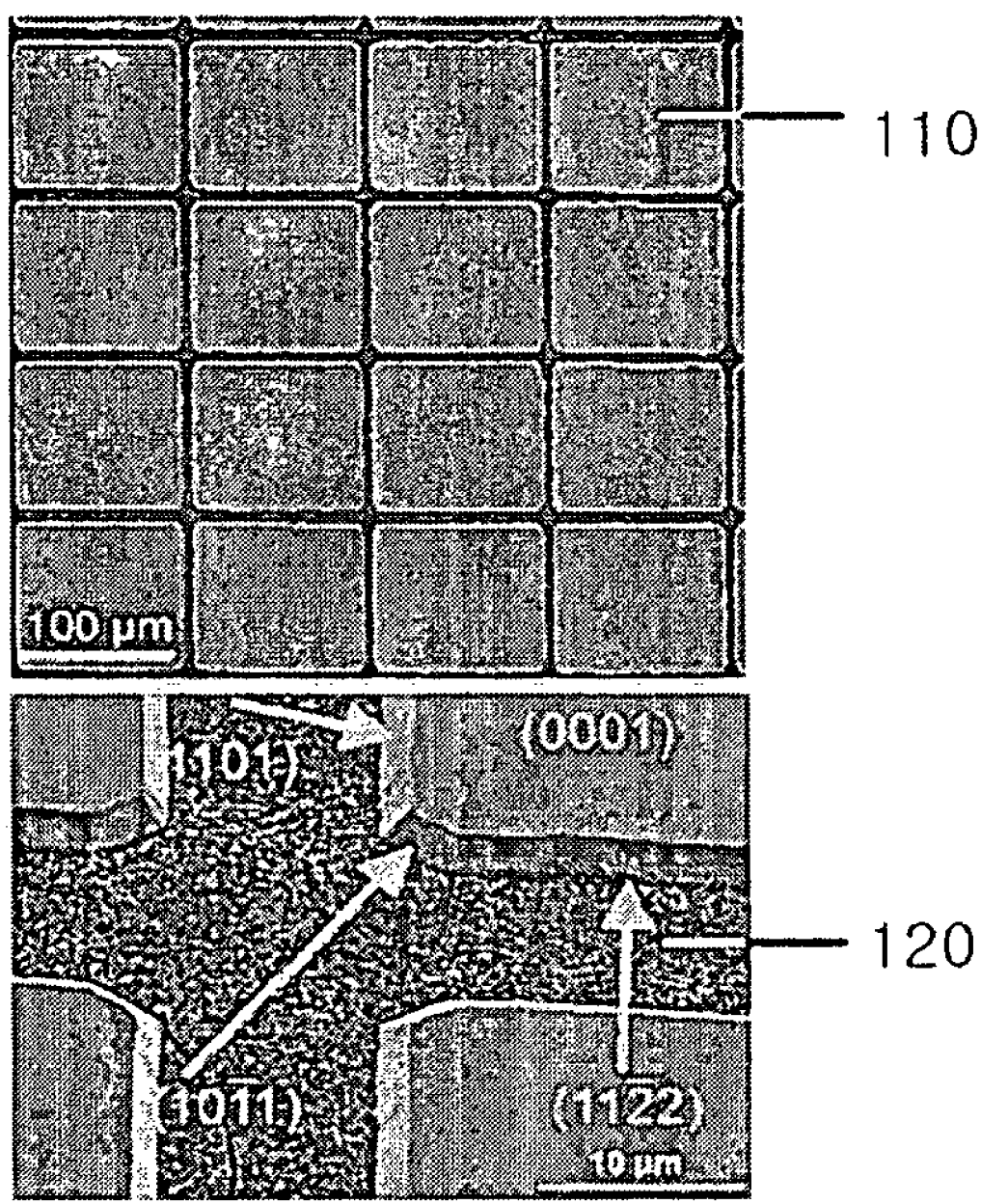
FIG. 1 is a plan view of a semiconductor light emitting device having a conventional prior art Si substrate.

A semiconductor light emitting diode and a method of manufacturing the semiconductor light emitting diode according to the present invention will now be described more fully with reference to the accompanying drawings, in which exemplary embodiments of the invention are shown. In the drawings, the thicknesses of layers and regions are exaggerated for clarity.

Figure 2A:
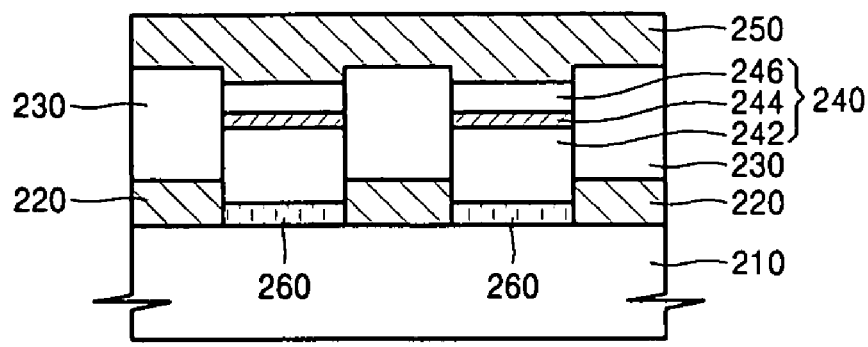
FIG. 2A is a cross-sectional view of a semiconductor light emitting device according to an embodiment of the present invention.

FIG. 2A is a cross-sectional view of a semiconductor light emitting device according to an embodiment of the present invention.

Referring to FIG. 2A, a semiconductor light emitting device includes a substrate 210, at least two light emitting cells 240 located on the substrate 210 and formed by stacking semiconductor material layers, a reflection layer 220 and a transparent insulating layer 230 sequentially stacked between the light emitting cells 240, and a transparent electrode 250 covering the upper surfaces of the light emitting cells 240. The substrate 210 can be formed of silicon Si.

The reflection layer 220 may be formed of a material that can readily reflect light generated by the light emitting cells 240. For example, the material can be a metal layer, a plurality of dielectric layers, or a plurality of stacked layers in which one or more pairs of a metal layer and a dielectric layer are repeatedly stacked. The transparent insulating layer 230 may be formed of a light transmissive material to transmit light emitted from the light emitting cells 240 to the outside, as well as an insulating material to prevent shorting between the electrodes. For example, the transparent insulating layer 230 can be formed of at least one of $SiO_2$, $SiN_x$, $Al_2O_3$, HfO, ZrO, $TiO_2$, or ZnO. The transparent electrode 250 can be formed of a metal or a transparent conductive oxide (TCO). The metal can be Au, Pd, Pt, Ru, or Ni. The TCO can be ZnO or In oxide. The In oxide can be formed by combining In with at least one element selected from the group consisting of Mg, Ag, Zn, Sc, Hf, Zr, Te, Se, Ta, W, Nb, Cu, Si, Ni, Go, Mo, Cr, Mn, Hg, Pr, and one component of the La group.

The light emitting cells 240 include a lower GaN layer 242, an active layer 244, and an upper GaN layer 246, which are sequentially stacked on the substrate 210. The active layer 244 may be formed of a III-V nitride group compound semiconductor layer of the GaN group, expressed by a general formula of InxAlyGa1-x-yN. Here, the active layer 244 can have a multi quantum well (MQW) structure or a single quantum well (SQW) structure. The structure of the active layer 244 does not limit the technical scope of the present invention.

Figure 2B:
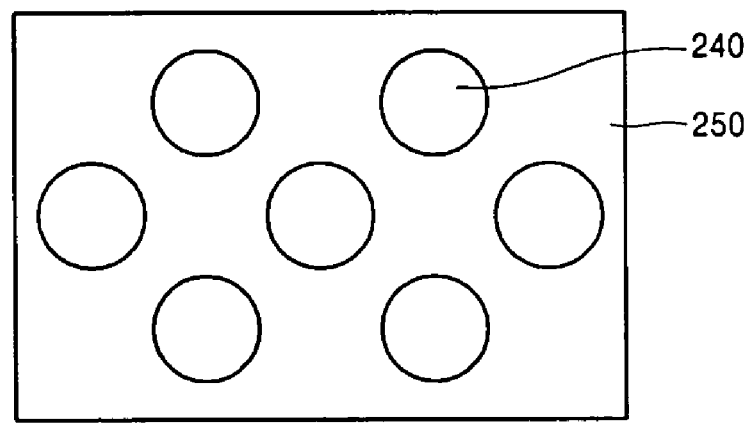
FIG. 2B is a plan view of a semiconductor light emitting device according to an embodiment of the present invention.

FIG. 2B is a plan view of a semiconductor light emitting device according to an embodiment of the present invention.

Referring to FIG. 2B, a few light emitting cells 240 are separated from each other. The separated structure of the light emitting cells 240 reduces residual stresses of the nitride semiconductor and helps prevent cracks in the Si substrate.

A buffer layer 260 can further be included between the substrate 210 and the light emitting cells 240. The buffer layer 260 can be a III-V nitride group semiconductor layer of the GaN group.

To reduce shorts between electrodes and to enhance the insulation of the light emitting cells 240, the sum of the thicknesses of the transparent insulating layer 230 and the reflection layer 220 must be greater than the thickness of the light emitting cell 240. Also, to facilitate the light refraction, the transparent insulating layer 230 may be formed of a material having a lower refractive index than the active layer 244 and the upper and lower GaN layers. The transparent insulating layer 230 may be thicker than the reflection layer 220 so that the reflection layer 220 can reflect more light than the transparent insulating layer 230.

Figure 2C:
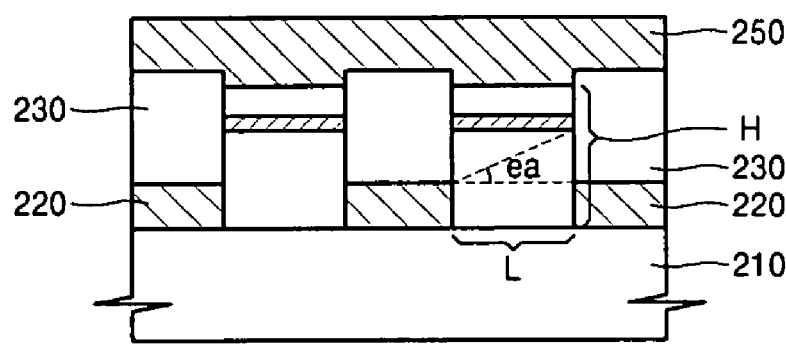
FIG. 2C is a cross-sectional view of a semiconductor light emitting device showing the reflection of light emitted from an active layer by a reflection layer according to the present invention.

FIG. 2C is a cross-sectional view of a semiconductor light emitting device showing the reflection of light emitted from an active layer by a reflection layer according to the present invention.

Referring to FIG. 2C, light can easily be emitted from the side of the active layer 244 if an escape angle "ea" on the transparent insulating layer 230 is less than the total internal reflection angle, that is, an inverse sine of the refractive index ni of the transparent insulating layer 230 to the refractive index ns of the light emitting cell 240, i.e., $ea < \sin^{-1}(ni/ns)$. To meet this requirement, the ratio of the thickness (H) to the width (L) of the light emitting cell 240 may be greater than or equal to the tangent of the total internal reflection angle "ea", which is expressed by equation (1) below.

$$H/L \geq \tan(ea) \tag{1}$$

where L is the width of the light emitting cell 240, and H is the thickness of the light emitting cell 240.

Accordingly, to increase the emission efficiency of light, the thickness of the light emitting cell 240 may be set so that the light emitted from the active layer 244 can pass through the interface between the light emitting cell 240 and the transparent insulating layer 230.

The formation of the transparent insulating layer 230, the transparent electrode 250, and the reflection layer 220, and the thickness limitation of each of the layers, can increase the light emission rate of the semiconductor light emitting device.

Figure 3:
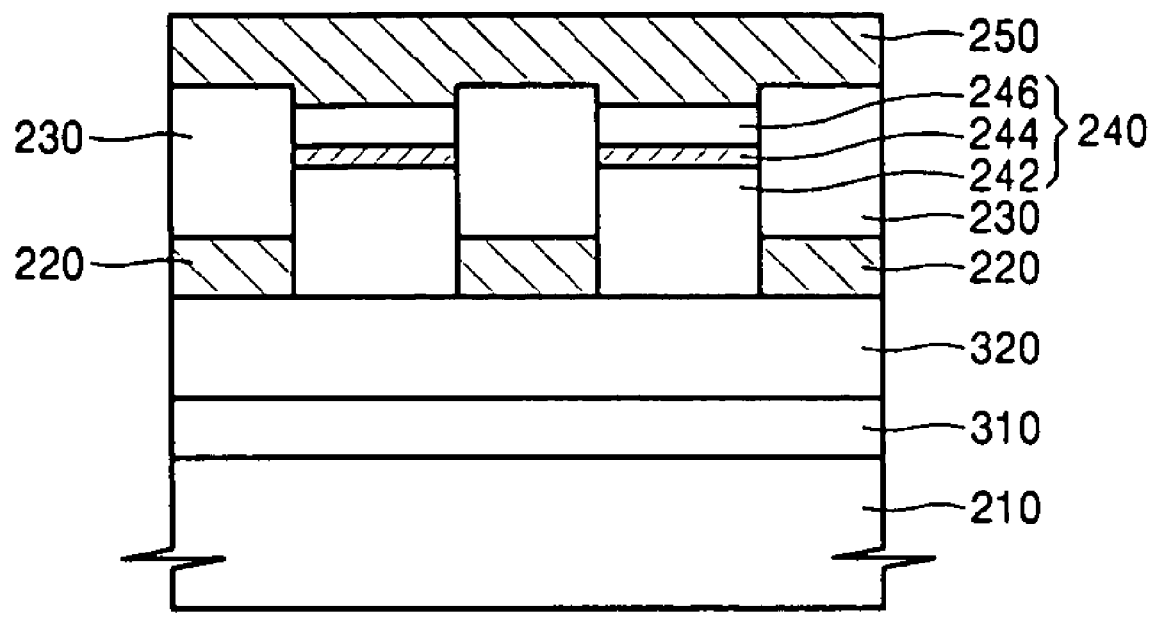
FIG. 3 is a cross-sectional view of a semiconductor light emitting device according to another embodiment of the present invention.

FIG. 3 is a cross-sectional view of a semiconductor light emitting device according to another embodiment of the present invention.

Referring to FIG. 3, a GaN layer 320 is interposed between the substrate 210 and the light emitting cell 240.

A buffer layer 310 can further be included between the substrate 210 and the GaN layer 320. For example, the buffer layer 310 can be a III-V nitride group semiconductor layer of the GaN group.

The GaN layer 320 facilitates the growing of the lower layer 242 without additional help from the buffer layer 310, and also facilitates the current flow through the substrate 210 since the current flows through a wide contact area of a lower part of the GaN layer 320.

A method of manufacturing a semiconductor light emitting device will now be described with reference to FIGS. 4A through 4D.

FIGS. 4A through 4D are cross-sectional views illustrating a method of manufacturing the semiconductor light emitting device according to still another embodiment of the present invention.

Figure 4A:
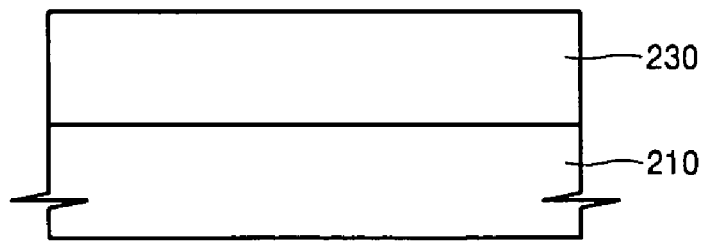
FIGS. 4A through 4D are cross-sectional views illustrating a method of manufacturing a semiconductor light emitting device according to still another embodiment of the present invention.
Figure 4B:
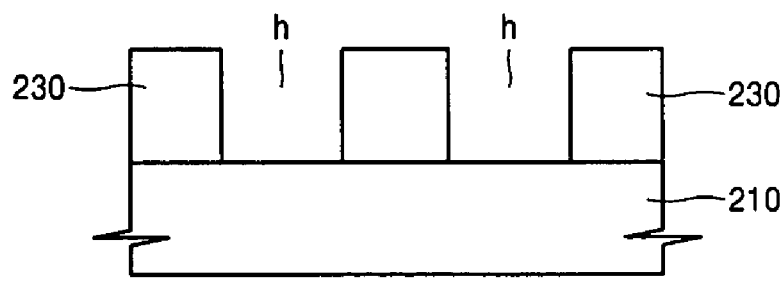
Figure 4C:
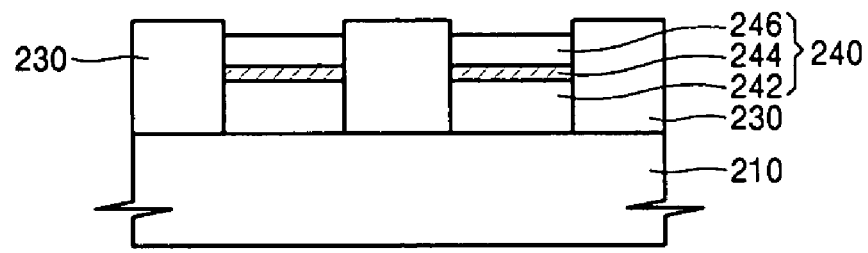
Figure 4D:
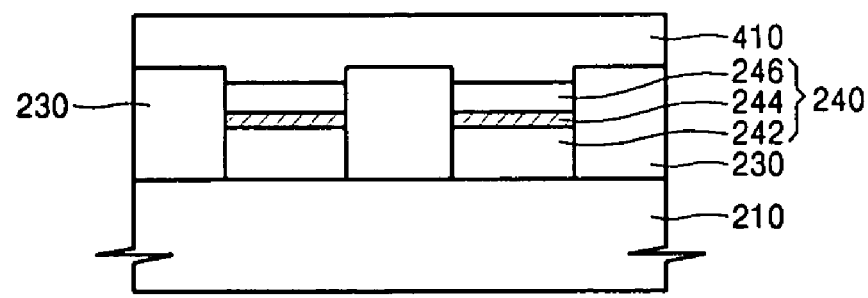

Referring to FIGS. 4A through 4D, the method includes forming a transparent insulating layer 230 on a substrate 210 (FIG. 4A), forming at least one hole h in the transparent insulating layer 230 (FIG. 4B), forming a light emitting cell 240 in the hole h (FIG. 4C), forming a transparent electrode 410 covering the light emitting cells 240 (FIG. 4D). The substrate 210 can be formed of Si.

The forming of the light emitting cell 240 (FIG. 4C) in the hole includes sequentially forming a lower GaN layer 242, an active layer 244, and an upper GaN layer. The active layer 244 may be formed of a III-V nitride group compound semiconductor layer of the GaN group expressed by a general formula of InxAlyGa1-x-yN. Here, the active layer 244 can have a multi quantum well (MQW) structure or a single quantum well (SQW) structure. The structure of the active layer 244 does not limit the technical scope of the present invention.

The transparent insulating layer 230 may be thicker than the light emitting cell 240, to increase the insulation of the transparent insulating layer 230. The transparent insulating layer 230 may be formed of a material having a lower refractive index than the active layer 244, the upper GaN layer, and the lower GaN layer 242, to facilitate the light refraction of the transparent insulating layer 230. The transparent insulating layer 230 is formed of at least one of $SiO_2$, $SiN_x$, $Al_2O_3$, $HfO$, $ZrO$, $TiO_2$, or $ZnO$. The transparent electrode 410 may be formed of a conductive and light transmissive material, such as a metal or transparent conductive oxide (TCO). The metal can be Au, Pd, Pt, Ru, or Ni. The TCO can be ZnO or In oxide. The indium In oxide can be formed by combining In with at least one element selected from the group consisting of Mg, Ag, Zn, Sc, Hf, Zr, Te, Se, Ta, W, Nb, Cu, Si, Ni, Co, Mo, Cr, Mn, Hg, Pr, and one component of the La group.

FIGS. 5A through 5D are cross-sectional views illustrating a method of manufacturing a semiconductor light emitting device according to yet another embodiment of the present invention.

Figure 5A:
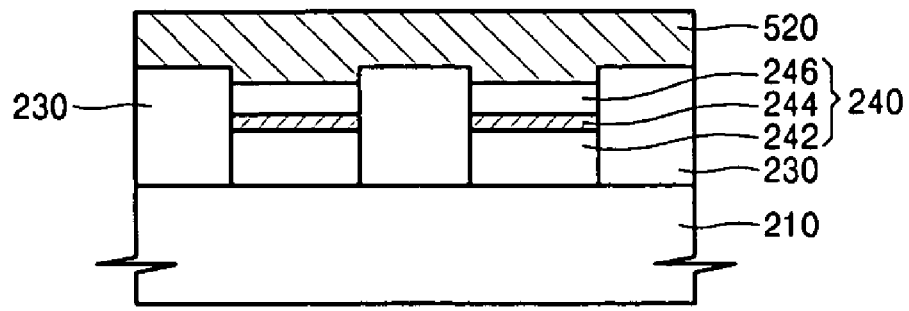
FIGS. 5A through 5D are cross-sectional views illustrating a method of manufacturing a semiconductor light emitting device according to yet another embodiment of the present invention.
Figure 5B:
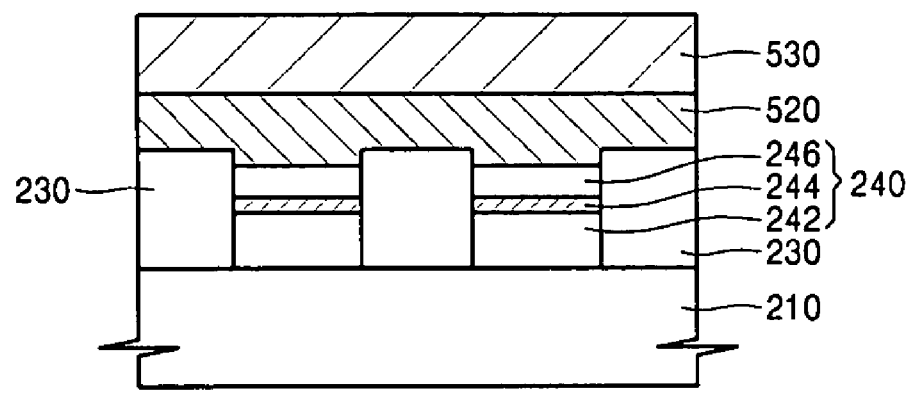
Figure 5C:
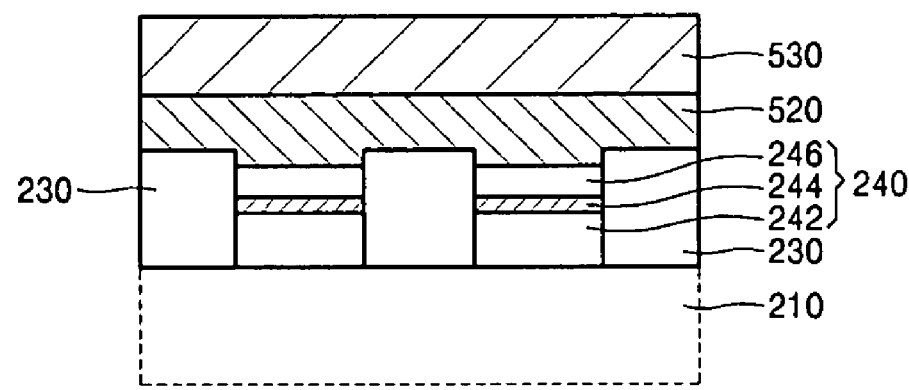
Figure 5D:
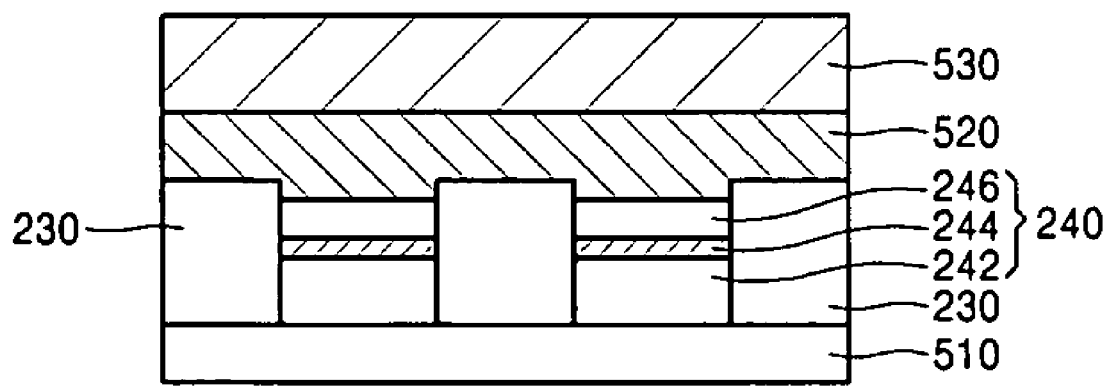

Referring to FIGS. 5A through 5C, the forming of the transparent electrode 410 covering the light emitting cells 240 (FIG. 4D) includes forming a reflection electrode 520 covering the transparent insulating layer 230 and the light emitting cell 240 (FIG. 5A). The forming of the transparent electrode 410 covering the light emitting cells 240 (FIG. 4D) further includes forming a heat transfer layer 530 on the reflection electrode 520 (FIG. 5B). Also, the forming of the transparent electrode 410 covering the light emitting cells 240 (FIG. 4D) further includes removing the substrate 210 (FIG. 5C) and forming a transparent electrode 510 covering the lower surface of the light emitting cell 240 (FIG. 5D).

The heat transfer layer 530 may be formed of a material having high thermal conductivity, such as Cu, Si, or Cu alloy, so as to effectively discharge heat generated by the light emitting cell 240. If Cu is used for the heat transfer layer 530, current can readily flow to the light emitting cells 240 due to the high electrical conductivity of the Cu heat transfer layer.

Light is emitted to the outside through the transparent electrode 510 and the light is reflected by the reflection electrode. When the substrate 210 is removed, the optical output can be increased since the light can be emitted to the outside instead of being absorbed by the substrate 210. Accordingly, this structure can be used for manufacturing a high optical output semiconductor light emitting device.

Figure 6A:
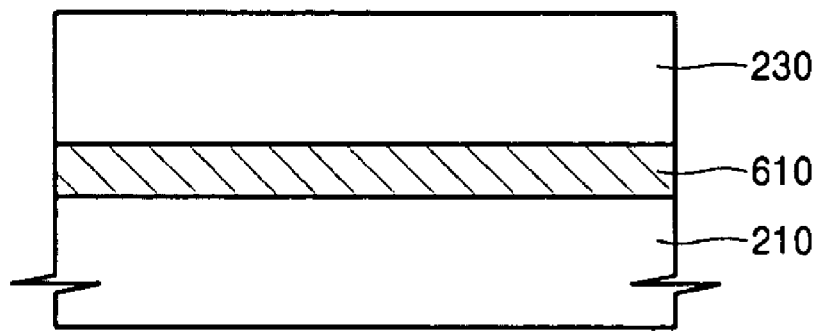
FIG. 6A through 6C are cross-sectional views illustrating a method of manufacturing the semiconductor light emitting device of FIG. 2A according to an embodiment of the present invention.
Figure 6B:
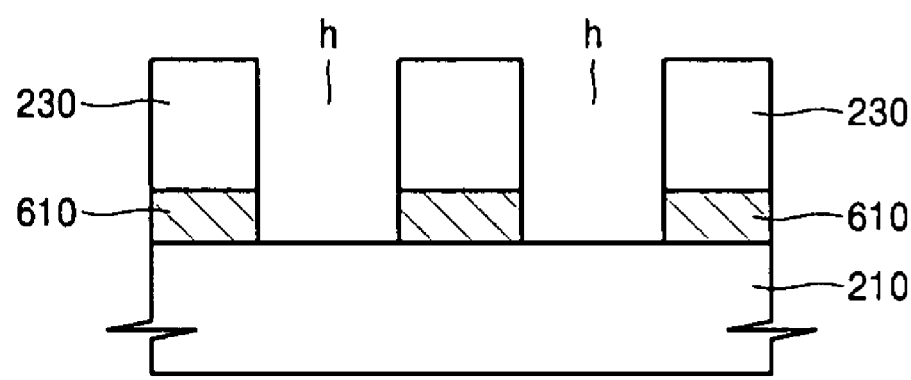
Figure 6C:
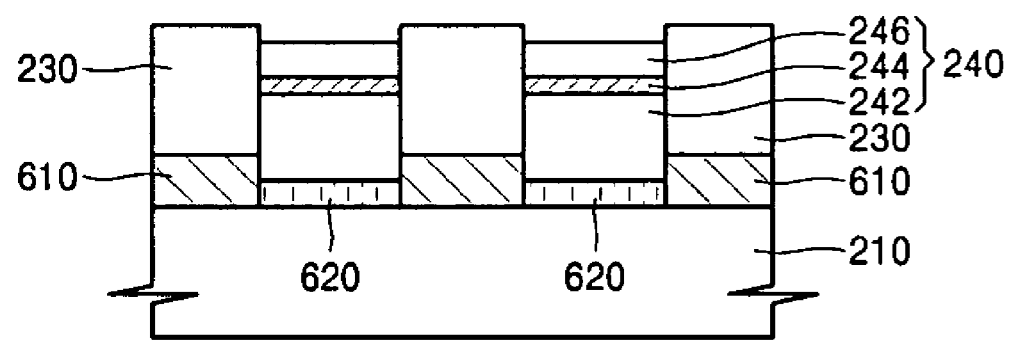

FIG. 6A through 6C are cross-sectional views illustrating a method of manufacturing the semiconductor light emitting device (FIG. 2A) according to an embodiment of the present invention.

Referring to FIGS. 6A through 6C, the forming of the transparent insulating layer 230 on a substrate 210 (FIG. 4A) further includes forming a reflection layer 610 between the substrate 210 and the transparent insulating layer 230 (FIG. 6A). The forming of at least one hole in the transparent insulating layer 230 (FIG. 4B) includes forming a hole between the transparent insulating layer 230 and the reflection layer 610 until the substrate 210 is exposed. The reflection layer 610 may be formed of a material that can easily reflect light emitted from the active layer 244. For example, the material can be a metal layer, a plurality of dielectric layers, or a plurality of stacked layers in which one or more pairs of a metal layer and a dielectric layer are repeatedly stacked.

Referring to FIG. 6C, the forming of the light emitting cell 240 in the hole (FIG. 4C) can further include forming a buffer layer 620 between the lower GaN layer 242 and the substrate 210. The buffer layer 620 can be a III-V nitride group semiconductor layer of the GaN group.

To reduce shorts between electrodes and to enhance the insulation of the light emitting cells 240, the sum of the thicknesses of the transparent insulating layer 230 and the reflection layer 610 may be greater than the thickness of the light emitting cell 240. The transparent insulating layer 230 may be thicker than the reflection layer 610, so that the reflection layer 610 can reflect more light. The ratio of the thickness (H) to the width (L) of each of the light emitting cells 240 may be greater than or equal to the tangent of the total internal reflection angle "ea", which is expressed by equation (1) above. FIG. 2A is a cross-sectional view of the semiconductor light emitting device obtained according to the method described with reference to FIGS. 6A through 6C.

Figure 7A:
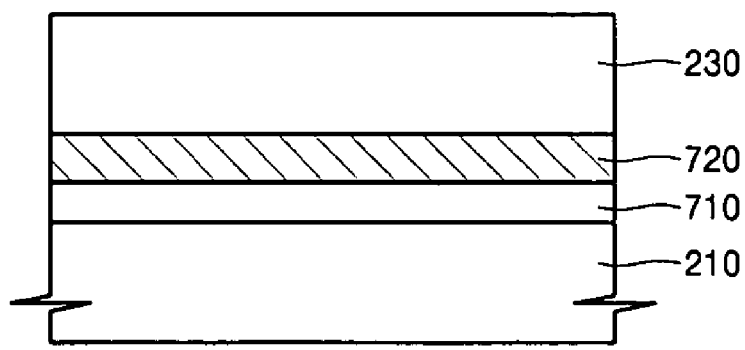
FIG. 7A through 7C are cross-sectional views illustrating a method of manufacturing the semiconductor light emitting device of FIG. 3 according to another embodiment of the present invention.
Figure 7B:
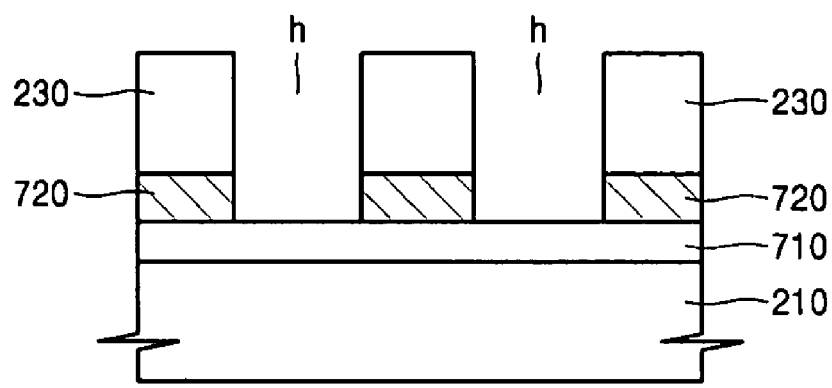
Figure 7C:
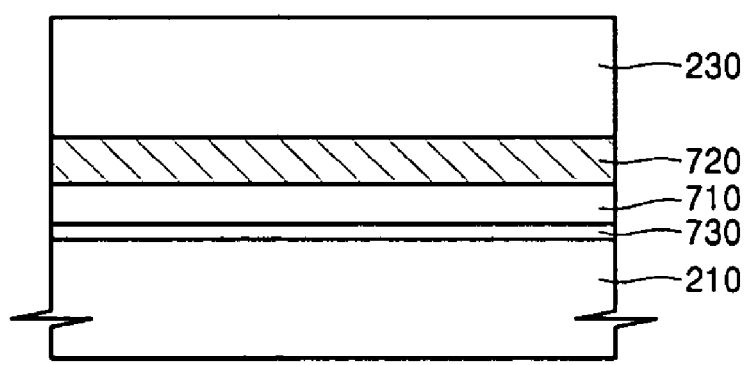

FIG. 7A through 7C are cross-sectional views illustrating a method of manufacturing the semiconductor light emitting device (FIG. 3) according to another embodiment of the present invention.

Referring to FIGS. 7A through 7C, the forming of the transparent insulating layer 230 on a substrate 210 (FIG. 4A) further includes sequentially forming a GaN layer 710 and a reflection layer 720 between the substrate 210 and the transparent insulating layer 230 (FIG. 7A). The forming of at least one hole h in the transparent insulating layer 230 (FIG. 4B) includes forming the hole h in the transparent insulating layer 230 and the reflection layer 720 until the GaN layer 710 is exposed (FIG. 7B). The reflection layer 720 may be formed of a material that can easily reflect light emitted from the active layer 244. For example, the material can be a metal layer, a plurality of dielectric layers, or a plurality of stacked layers in which one or more pairs of a metal layer and a dielectric layer are repeatedly stacked.

The GaN layer 710 facilitates the growing of the lower layer 242 without additional help from the buffer layer, and also facilitates the current flow through the substrate 210 by providing a wide contact area with the lower part of the GaN layer 320.

Referring to FIG. 7C, the forming of the transparent insulating layer 230 on the substrate 210 (FIG. 4A) can further include forming a buffer layer 730 between the substrate 210 and the GaN layer 710. The buffer layer 730 can be a III-V nitride group semiconductor layer of the GaN group.

The sum of the thicknesses of the transparent insulating layer 230 and the reflection layer 720 may be greater than the thickness of the light emitting cell 240. The transparent insulating layer 230 may be thicker than the reflection layer 720. The ratio of the thickness (H) to the width (L) of the light emitting cell may be greater than or equal to the tangent of the total internal reflection angle "ea", which is expressed by equation (1) above. FIG. 3 is a cross-sectional view of the semiconductor light emitting device obtained according to the method described with reference to FIGS. 7A through 7C.

The semiconductor light emitting device according to the present invention can reduce residual stress and its associated cracking around the light emitting cells, since a material that can reduce the residual stress is filled in the spaces between the light emitting cells arranged on a substrate. The material filling the spaces between the light emitting cells can be a transparent insulating layer as described in the aforementioned embodiments.

Also, the reflection layer formed on the substrate can reduce the absorption of light by the substrate. The thickness of the light emitting cells can be limited to ensure that the light emitted from the active layer is totally reflected. The transparent insulating layer filled in the spaces between the light emitting cells can also maximize the emission of light to the outside. These methods can increase in the optical output of the semiconductor light emitting device.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A light emitting device comprising:
  a substrate;
  at least two light emitting cells located on the substrate to be in contact with the upper surface of the substrate and having semiconductor material layers including a lower semiconductor material layer, an active layer and an upper semiconductor material layer sequentially grown on the substrate;
  stacked layers including a reflection layer formed on an entire area of the substrate between the light emitting cells, and a transparent insulating layer formed on an entire upper surface of the reflection layer, wherein a first side of the stacked layers contacts one of the two light emitting cells and a second side of the stacked layers contacts another of the two light emitting cells; and
  a transparent electrode covering an entire area of the upper surface of the light emitting cells.

2. The light emitting device of claim 1 the semiconductor material layers further comprising a buffer layer between the substrate and the lower semiconductor material layer.

3. The light emitting device of claim 1, wherein the sum of the thicknesses of the transparent insulating layer and the reflection layer is greater than the thickness of the light emitting cell.

4. The light emitting device of claim 1, wherein the transparent insulating layer is thicker than the reflection layer.

5. The light emitting device of claim 1, wherein a ratio of a thickness to a width of the light emitting cell is greater than or equal to a tangent of a total internal reflection angle of the transparent insulating layer with respect to the light emitting cell.

6. The light emitting device of claim 1, wherein the substrate is formed of silicon Si.

7. The light emitting device of claim 1, wherein the transparent insulating layer has a lower refractive index than a semiconductor material layer that constitutes the light emitting cell.

8. The light emitting device of claim 1, wherein the transparent insulating layer is formed of at least one of $SiO_2$, $SiN_x$, $Al_2O_3$, HfO, ZrO, $TiO_2$, and ZnO.

9. The light emitting device of claim 1, wherein the transparent electrode is formed of one of a metal and a transparent conductive material (TCO).

10. The light emitting device of claim 9, wherein the metal is one of Au, Pd, Pt, Ru, and Ni.

11. The light emitting device of claim 9, wherein the TCO is one of ZnO and indium oxide.

12. The light emitting device of claim 11, wherein the indium oxide further comprises at least one element selected from the group consisting of Mg, Ag, Zn, Sc, Hf, Zr, Te, Se, Ta, W, Nb, Cu, Si, Ni, Go, Mo, Cr, Mn, Hg, Pr, and one component of the La group.

13. The light emitting device of claim 1, wherein the reflection layer is formed of a metal layer.

14. The light emitting device of claim 1, wherein the reflection layer is formed of a plurality of dielectric layers.

15. The light emitting device of claim 1, wherein the reflection layer is formed of a plurality of stacked layers in which one or more pairs of a metal layer and a dielectric layer are repeatedly stacked.

16. The light emitting device of claim 1 the semiconductor material layers further comprising a GaN layer between the substrate and the lower semiconductor material layer.

17. The light emitting device of claim 16 the semiconductor material layers further comprising a buffer layer between the substrate and the GaN layer.

18. The light emitting device of claim 2, wherein the buffer layer is a III-V group nitride semiconductor layer of the GaN group.

* * * * *